United States Patent [19]

Oliver

[11] Patent Number: 4,675,673
[45] Date of Patent: Jun. 23, 1987

[54] PROGRAMMABLE PIN DRIVER SYSTEM

[76] Inventor: Douglas E. Oliver, 25 Northwoods La., La Crescenta, Calif. 91214

[21] Appl. No.: 574,599

[22] Filed: Jan. 27, 1984

[51] Int. Cl.[4] .................. H04Q 1/00; H03K 19/08
[52] U.S. Cl. .................. 340/825.87; 364/488; 364/580; 371/20; 324/158 F
[58] Field of Search .............. 364/488, 489, 490, 580; 371/20, 21, 28; 365/218, 222, 201, 205; 324/158 F, 158 D, 158 R, 158 T; 303/231; 340/825.07, 825.54, 825.85, 825.87

[56] References Cited

U.S. PATENT DOCUMENTS

| Re. 31,056 | 10/1982 | Chau et al. | 371/20 |
| 4,335,457 | 6/1982 | Early | 371/20 |
| 4,439,858 | 3/1984 | Petersen | 371/20 |

FOREIGN PATENT DOCUMENTS

| 0019381A | 4/1979 | European Pat. Off. |
| 1592115 | 9/1975 | United Kingdom . |
| 1555741 | 6/1976 | United Kingdom . |
| 1488192 | 10/1977 | United Kingdom . |
| 2028615A | 6/1978 | United Kingdom . |
| 2102644A | 6/1982 | United Kingdom . |
| 2127642A | 9/1982 | United Kingdom . |

OTHER PUBLICATIONS

Hnatek, "Ausen's Handbook of DIA and AID Converters", 1976, pp. 13, 50–51, 182–184.
Millman, "Micro Electronics: Digital and Analog Circuits and Systems", 1979, pp. 609, 338–342.

Primary Examiner—Marshall M. Curtis
Attorney, Agent, or Firm—Lyon & Lyon

[57] ABSTRACT

Programmable pin drivers allow PROM pins to be individually programmed and regulated to specified voltages and currents. Each pin is assigned a voltage multiplexer to select a regulated voltage and a power amplifier to supply current. The source voltage to the power amplifier is determined by the maximum and minimum reference voltages needed by the device under test. This allows a full 70 volt range of pin voltages to be seleced without substitution of pin driver parts, although individual parts have a dynamic range of only about 40 volts, and reduces thermal power dissipation. It also allows very fast microprocessor-driven switching of input voltages to pins, by changing the reference voltages assigned to the individual pins' voltage multiplexers.

30 Claims, 5 Drawing Figures

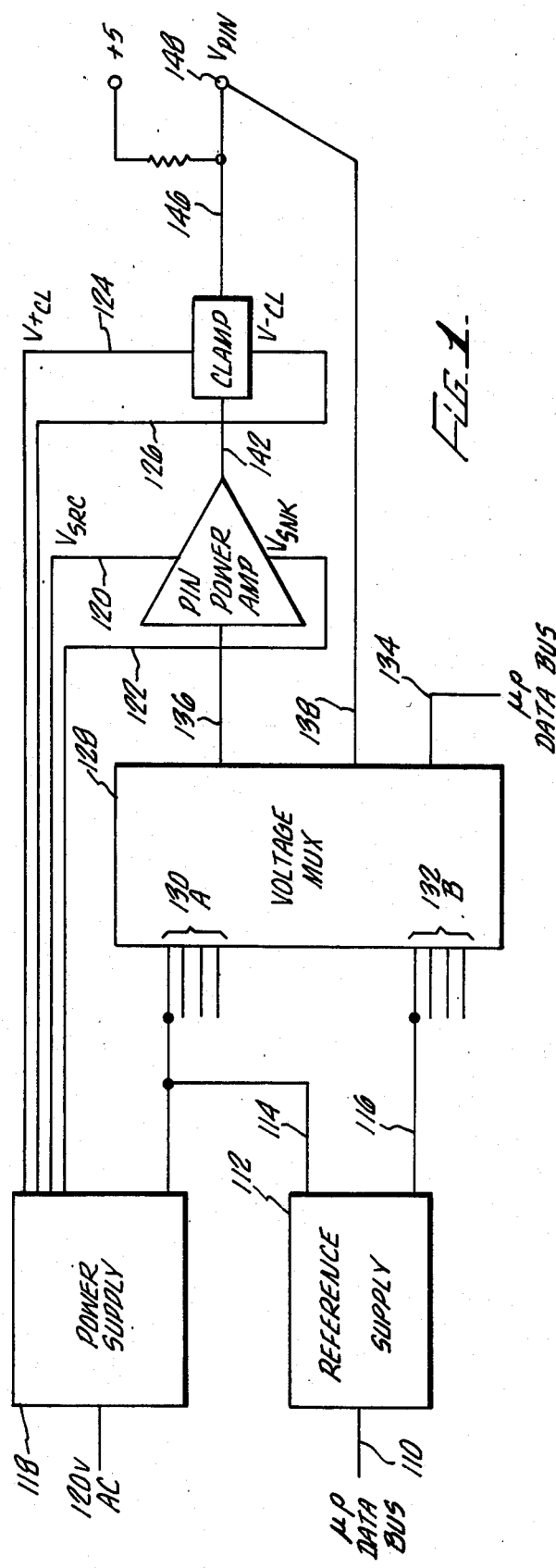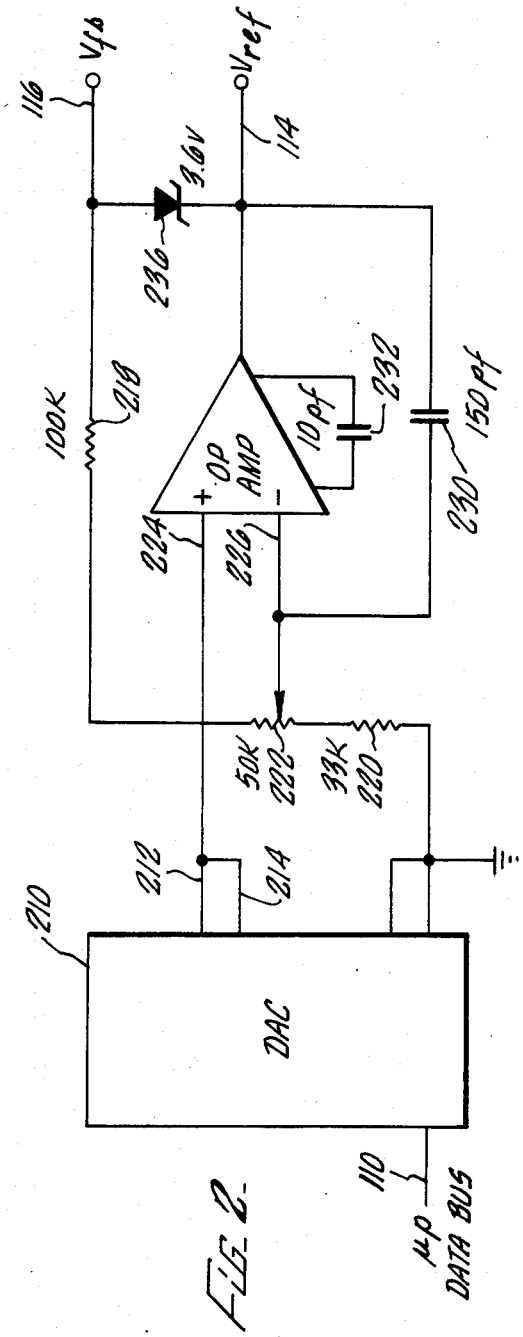

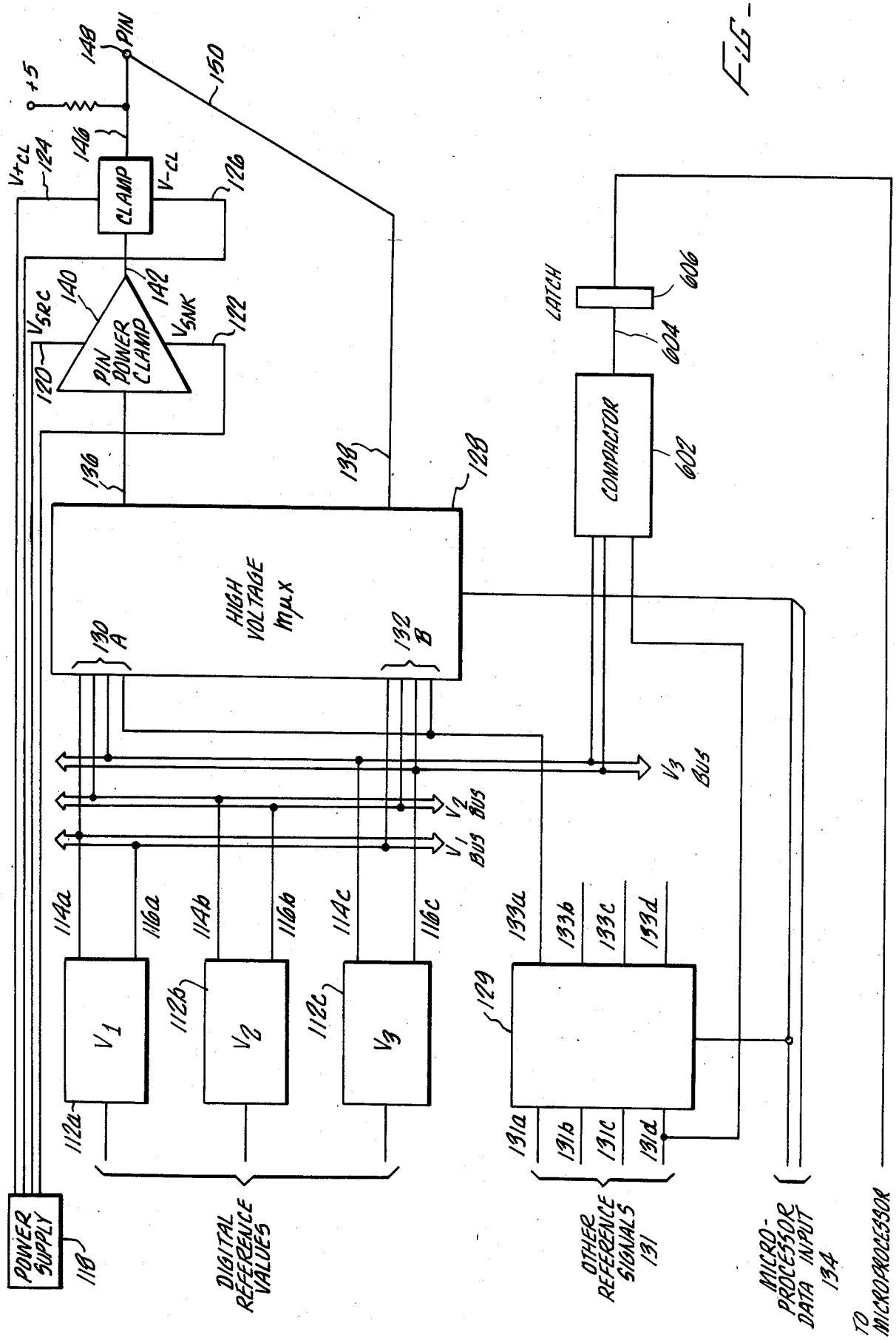

PROGRAMMABLE PIN DRIVER SYSTEM

FIELD OF THE INVENTION

This invention relates to a device for testing and programming semiconductor devices, e.g. programmable read-only memories (PROMs) and erasable programmable read-only memories (EPROMs). More specifically, this invention relates to regulation of the voltage and current at each pin of the semiconductor device being tested or programmed.

BACKGROUND OF THE INVENTION

Programmable semiconductor devices, such as programmable read-only memories (PROMs) and erasable programmable read-only memories (EPROMs), are in common use in present computer systems. They can be used as control memory or to substitute for combinations of logic gate components. Due to the many different kinds of devices, the many different manufacturers, and the many different applications which users wish to put these devices to, customization of programmable devices has become common. Programming these devices, and subsequent testing of already programmed devices, are major cost elements of the finished product. Due to this cost, it is generally desirable to make PROM programming as automatic as possible.

Programming is generally accomplished by electrical impulses applied to the input pins of the programmable device. The manufacturer specifies a set of voltages or other signals which are input to the programmable device, which will blow internal fuses or perform other "burn in" activity, to program the device. There is a wide variety of manufacturers' requirements for voltage levels to be applied to these programmable devices to successfully program them. Due to this wide variety, it is generally desirable to make PROM programming as flexible as possible.

THE PRIOR ART

In the general case, each pin must be presented with a different, yet carefully regulated, voltage. Present PROM programming systems usually provide several regulated voltage supplies, and connect them to the pins of the device under test ("DUT") with transistor switches. While this will accomplish the purpose of assigning a regulated voltage to each pin, the degree of regulation which can be achieved is limited, due to severe variances in switch operation with changes in temperature. Accordingly, there is a need for PROM programming systems which regulate voltages at the device under test more accurately.

Though not presently available, one proposed solution is to regulate each pin's input voltage at the pin itself. It would be simplest to assign a digital-to-analog converter ("DAC") and an amplifier to each pin and provide a separate digital input for each DAC. It may even be necessary to use a second DAC and amplifier to control current at the pin as well. While this second method accomplishes its purpose, it is wasteful of parts and can be very expensive. Accordingly, there is a need for PROM programming systems which do not incur the expense of complex circuitry per controlled device pin, yet can provide comparable flexibility with reasonable cost.

Because of the wide variety of semiconductor manufacturers and the wide variety of devices which each manufacturer produces, there is a severe voltage difference between the largest voltage and the smallest voltage which any currently marketed programmable semiconductor device requires. This voltage difference, about 70 volts, is more than can be handled by present low-cost voltage multiplexer technology. Parts which can handle a 70 volt range are much more expensive than parts which can handle the more typical 40 volt range which the programmable device will itself at most require. Present systems attempt to reduce the impact of this consideration by selecting "key pins" which will require the most extreme voltages and by requiring adapters which must be physically replaced for different classes of programmable devices. While this method accomplishes its purpose, it is inconvenient for the operator and it can easily introduce costly human error. Accordingly, there is a need for programmable PROM programming systems which are able to program the full dynamic range of currently manufactured programmable semiconductor devices, without the requirement for physical replacement of any parts.

The wide range of voltages which different semi-conductor devices require also leads to heavy thermal dissipation of power in the power supplies and in each pin amplifier. Present systems can only deal with this problem by adding large heatsinks; this accomplishes its purpose but is bulky and inconvenient. Accordingly, there is a need for PROM programming systems which generate much less thermal power dissipation.

Therefore, it is an object of the present invention to provide an apparatus for controlling the inputs to and measuring the outputs from the pins of a programmable semi-conductor device, where the voltage and current at each pin is regulated so as to program and test the device.

It is a second object of the present invention to provide an apparatus for controlling the inputs to a device, where the voltage at each pin and the current at each pin are regulated so as to allow for multiplexing of input signals to the device.

It is a third object of the present invention to provide for controlling the inputs to the pins of a programmable semiconductor device over the full dynamic range of approximately 70 volts which the currently available set of programmable devices requires, without requiring the physical replacement of any parts or modules in the programming system.

It is a fourth object of the present invention to provide multiplexing circuitry which replaces individual digital-to-analog converters, and eliminates the need to provide expensive circuitry per pin of the device under test.

And it is yet a fifth object of the present invention to provide power supply and pin amplification circuitry which generates much less thermal power dissipation and requires smaller and less bulky heatsinks.

These and other objects of the present invention will be more clearly understood from an examination of the specification, the drawings and the accompanying claims herein.

BRIEF DESCRIPTION OF THE INVENTION

A programmable microprocessor is used to output a set of digitally coded reference voltages. These voltages are input to a set of reference voltage supplies, which convert them to analog reference voltages. The reference voltages are used to control input to and measure output from the device under test ("DUT").

Reference voltages are input to the power supply, which generates the rail voltages and clamp voltages. Rail voltages and clamp voltages are set just above the maximum reference voltage and just below the minimum reference voltage, so as to include all the reference voltages in the range between.

All the reference voltages are input to each voltage multiplexer, which selects one of them under microprocessor control. There is one voltage multiplexer per pin of the DUT. The microprocessor selects one reference voltage per pin when controlling input to the device under test; it may also select one of several comparators, via a "floating line," to measure output from the device under test.

Reference voltages output from the voltage multiplexer are power amplified, using the rail voltages to supply power. Amplified voltages are clamped at the pin of the device under test using the clamp voltages. Thus, the device pin will receive a measured voltage which does not overshoot the manufacturer's specifications for that device.

BRIEF DESCRIPTION OF THE DIAGRAMS

FIG. 1 is a functional diagram of the programmable pin driver system.

FIG. 2 is a schematic of the reference voltage supply.

FIG. 5 is a schematic of the pin driver circuitry, including the pin power amplifier and voltage clamp.

DETAILED DESCRIPTION OF THE INVENTION

Figure 3:
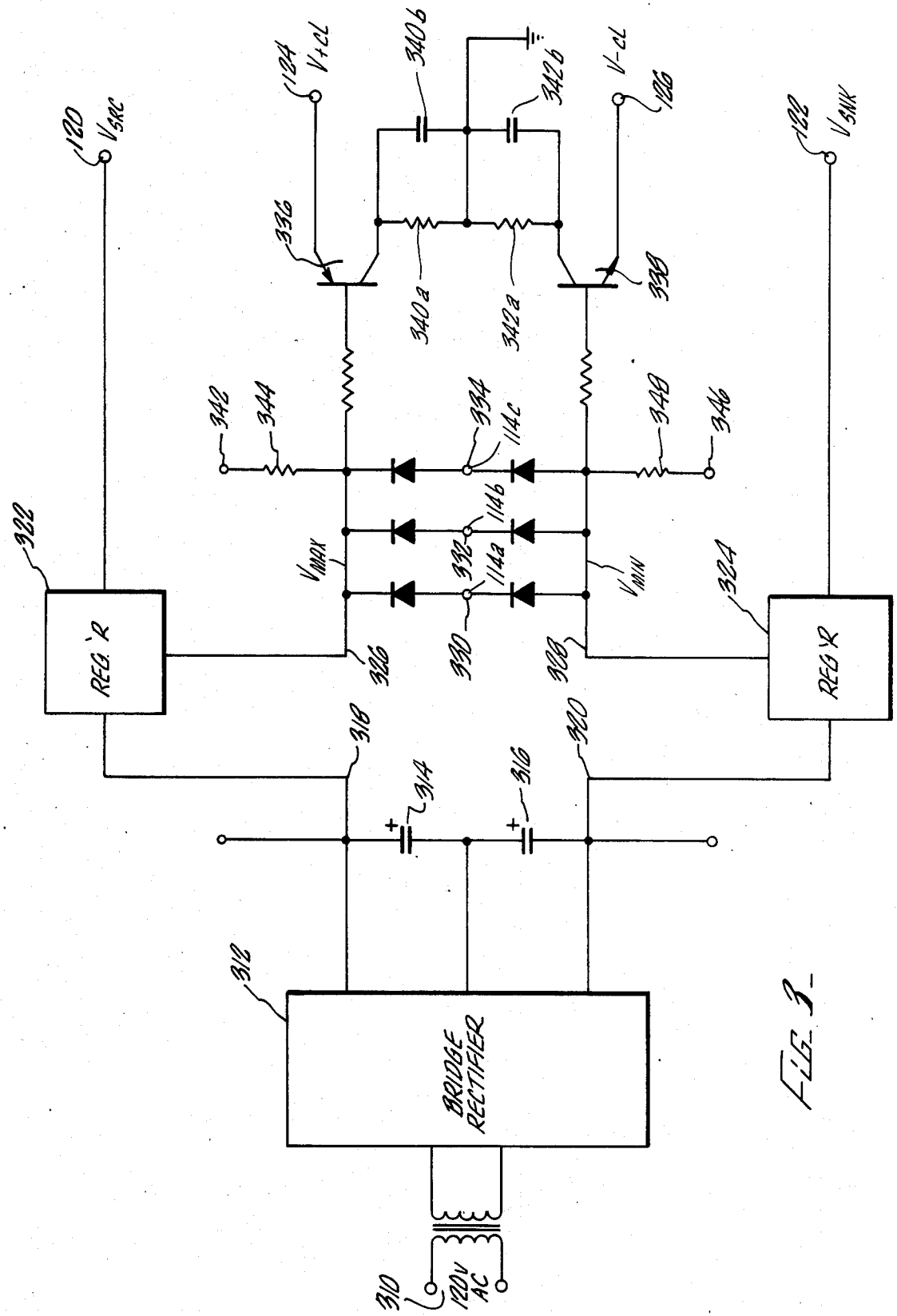
FIG. 3 is a schematic of the power supply.

Referring now to FIG. 1, the pin driver system is depicted. A programmable microprocessor (not shown) supplies a set of digital voltage reference values to the system. Each digital value is input on a microprocessor data-line 110 to a reference voltage supply 112. Each reference voltage supply has an output reference voltage, $v_{ref}$ 114, and an input feedback line for the reference voltage supply, $v_{fb}$ 116.

The reference voltage $v_{ref}$ 114 is then input to the power supply 118 along with the other reference voltages. The power supply finds the maximum of the input reference voltages $v_{max}$ 326 (described with respect to FIG. 3) and the minimum of the input reference voltages $v_{min}$ 328 (also described with respect to FIG. 3). It sets the output rail voltage $v_{src}$ 120 to be 5 volts greater than $v_{max}$; it sets the output rail voltage $v_{snk}$ 122 to be 5 volts less than $v_{min}$.

The reference voltage $v_{ref}$ 114 and the feedback voltage $v_{fb}$ 116 are also input to each pin's voltage multiplexer 128. Each reference voltage is collected along with other reference voltages in selection group A 130, while each feedback line is collected with other feedback lines in selection group B 132. (At this point, the voltage multiplexer is also supplied with several reference voltages which are constants and whose values are not under microprocessor control. This is further described with reference to FIG. 4.) The voltage multiplexer, under control of a microprocessor data-bus 134, produces an output reference voltage 136 and an output feedback line 138 which are electrically connected to one of the four sets of input reference voltages $v_{ref}$ 114 and input feedback lines $v_{fb}$ 116.

The output reference voltage is input to the pin power amplifier 140, which draws power from the rail voltages $v_{src}$ 120 and $v_{snk}$ 122. It amplifies the current to be input to the device pin from the very low values handled by the voltage multiplexer. At the output from the pin power amplifier, the pin power output 142 is input to the pin voltage clamp 144, which uses the clamping voltages $v_{+cl}$ 124 and $v_{-cl}$ 126 as controls. The pin clamp output 146 is connected directly to the selected pin of the device under test.

The device pin 148 is in turn connected to the pin feedback line 150. The pin feedback line is connected to the output feedback value 138 from the voltage multiplexer for this pin, forming a complete closed loop circuit between the reference voltage supply 112 and the device pin.

Referring now to FIG. 2, the reference voltage supply is depicted. The programmable microprocessor (not shown) asserts a digital reference voltage value on the microprocessor data-bus 110 input to the digital to analog converter ("DAC") 210. The DAC converts this to an analog reference voltage output value 212, which is tied back to the DAC voltage output sense value 214.

Since the DAC output range is not the full voltage range desired, a voltage multiplier stage is required. This stage is composed of an operational amplifier ("opamp") 216, two feedback resistors 218 and 220, and a precision potentiometer 222.

The DAC's output 212 is input to the opamp's plus terminal 224, and the reference voltage feedback 116 is connected to the opamp's minus terminal 226. Due to the presence of the feedback resistors 218 and 220, a constant fraction of the feedback line voltage appears at the opamp's minus terminal. Because the opamp's output 114 is used as $v_{ref}$ a closed-loop amplifier is formed, and as is well-known in the art, the output voltage $v_{fb}$ 114 ($v_{pin}$ 148) will be a constant multiple of the DAC's output 212.

The precision potentiometer 222 can be adjusted to alter the gain of the voltage multipler; this assures that $v_{pin}$ is exactly the value of the microprocessor expects. Another method, presently preferred, is to replace the potentiometer 222 with a precision resistor, allowing $v_{pin}$ to differ from the digital value input to the reference voltage supply. The offset voltage and gain introduced by the amplifier are measured and the results stored in microprocessor memory; the microprocessor adjusts the digital value which is input (to account for these differences) under software control.

Two capacitors are also used in the presently preferred embodiment. A 10 pf capacitor 232 is used to filter out "ringing" and eliminate overshoot of the desired voltage, by stabilizing the opamp. A 150 pf capacitor 230 is used to limit the rise-rate of the output, as is well known in the art.

Figure 4:
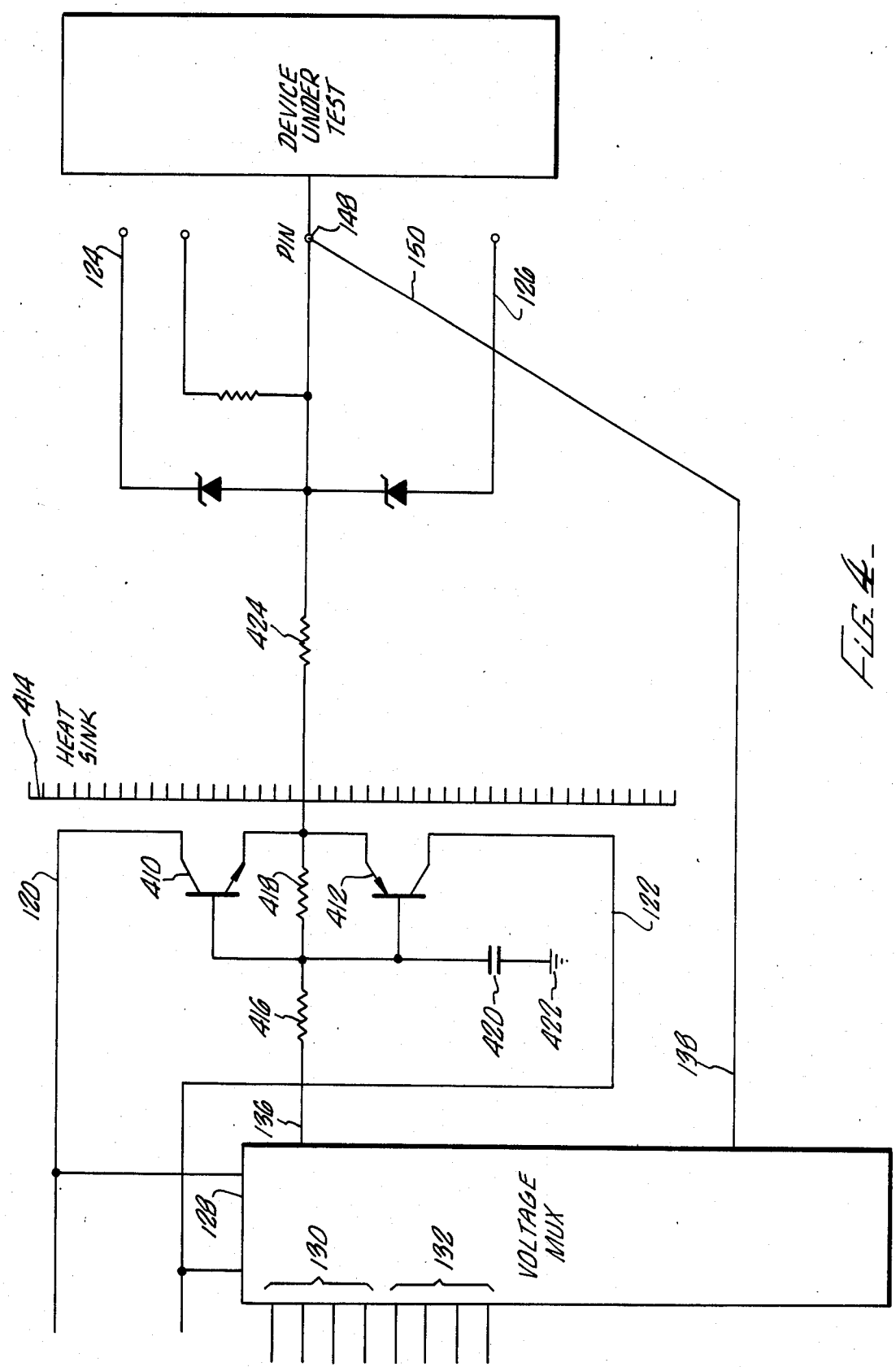
FIG. 4 is a more detailed schematic of the voltage multiplexer.

A 3.6 volt zener diode 236 connects the reference voltage output and the feedback output line. Normally, these output lines will differ by less than about 3.6 volts and the zener diode will appear as an open circuit. The operation of this diode when the voltage drop exceeds about 3.6 volts is further explained with reference to the pin power amplifier (FIG. 4).

Referring now to FIG. 3, the power supply schematic is depicted. An unregulated 120 volts AC (house current) 310 is input to a transformer and rectifier circuit, the latter composed of a bridge rectifier 312 and two high performance capacitors 314 and 316. This produces a voltage source of +48 volts (unregulated) at line 318 and −48 volts (unregulated) at line 320. These lines serve as the input power sources to regulators 322 and 324 respectively.

Three input reference voltages 114a, 114b, and 114c are input to diode pairs 330, 332 and 334 at these nodes respectively. The highest of these input voltages appears as $v_{max}$ 326, the lowest as $v_{min}$ 328. A +5 volt source 342 and pullup resistor 344 is used to set a lower bound for $v_{max}$ of +5 volts; similarly, a −5 volt source 346 and pulldown resistor 348 is used to set an upper bound for $v_{min}$ of −5 volts.

The maximum voltage $v_{max}$ 326 controls the upper regulator 322, which produces an output power voltage $v_{src}$ 120. The output power voltage is set 5 volts higher than $v_{max}$ 326. The maximum voltage $v_{max}$ also controls the emitter voltage of a transistor 336, producing an upper clamping voltage $v_{+cl}$ 124 which is about one volt less. An RC pair 340a, 340b is used to filter out high frequency components of $v_{+cl}$ which can be caused by the DUT.

Similarly, the minimum voltage $v_{min}$ 328 controls the lower regulator 324, which produces an output power voltage $v_{snk}$ 122. The output power voltage is set 5 volts lower than $v_{min}$ 328. The minimum voltage $v_{min}$ also controls the emitter voltage of a transistor 338, producing a lower clamping voltage $v_{-cl}$ 126 which is about one volt greater. An RC pair 342a, 342b is used to filter out high frequency components of $v_{-cl}$ 126.

Referring now to FIG. 4, the voltage multiplexer is depicted. As was disclosed with reference to FIG. 1, reference voltage supplies 112a, 112b and 112c output reference voltages $v_{ref}$ 114a, 114b, and 114c and feedback lines $v_{fb}$ 116, 116a, 116b and 116c respectively. The set of $v_{ref}$ is collected in select group A 130, and the set of $v_{fb}$ is collected in select group B 132, of a stage II multiplexer 128. Under control of a microprocessor dataline 134b, the stage II multiplexer selects an output reference voltage 136 and an output feedback line 138 which are electrically connected to the input lines.

One selectable line pair, i.e., one input line in select group A and one in select group B, are tied together and their value drawn from an output 133a, 133b, 133c or 133d of a stage I multiplexer 129. (The stage I multiplexers have four inputs and four independently-selectable outputs, so only one is needed per four stage II multiplexers.) Inputs to the stage I multiplexer 131 are other reference signals which are commonly needed. The presently preferred values are: (1) ground; (2) a "floated" line for measuring pin outputs; (3) a positive pulse; and (4) a negative pulse. The stage I multiplexer is controlled by a microprocessor data-bus 134a.

Six bits of microprocessor control data are needed to select multiplexer outputs. One bit is used to enable the stage II multiplexer select; two more bits are used to select one of the four input line pairs. Similarly, one bit is used to enable the stage I multiplexer select; two more bits are used to select one of the four input line pairs. The output pin is selected via the microprocessor address bus (not shown).

One input line 131d to the Stage I multiplexor 129 is "floated", i.e., no control voltage is set, so a pin output voltage 148 can be measured. This line 131d is tied to the input of a voltage comparator 602 and compared with a microprocessor-chosen measurement voltage output 114c, 116c from a reference voltage supply 112. Comparator output 604 is returned to the microprocessor via a data latch 606.

Referring now to FIG. 5, the pin power amplifier and pin driver clamp are depicted. The input power for the pin power amplifier is provided by $v_{src}$ 120 and the output is provided by $v_{snk}$ 122. Current is run through into two emitter-coupled Darlington transistors 410 and 412, and a heatsink 414 is provided to disperse any extra heat. The voltage multiplexer's output reference voltage 136 is input to the pin power amplifier; the output voltage is amplified and differs by about 1.8 volts, due to transistor drops.

A resistor 416 and capacitor 420 connect the input voltage to ground 422; this filters out high frequency components and removes transient voltage spikes which may cause overshoot or ringing. This is unnecessary in part because the voltage multiplexor will insert a 120 ns delay when voltage switching is performed; failing to filter this effect out could damage the device under test. The resistor 418 is also provided to allow the emitter of transmistor 410 to drain more quickly when the input voltage is removed.

A precision resistor 424 is also used to limit current. Since the precision resistor's resistance is 1 ohm, any attempt to draw more than 1.5 amps across this resistor will cause a 1.5 volt voltage drop between the voltage multiplexer's output reference voltage 136 and the later-collected output feedback voltage 138. This voltage drop, along with voltage differences introduced by the emitter-coupled Darlington transistors 410 and 412, and other components in the circuit, will appear in the reference voltage supply across the zener diode 236 of its output stage, and by exceeding that zener diode's breakdown voltage, cause a short circuit between $v_{fb}$ 116 and $v_{ref}$ 114. (In fact, a 3.6 volt zener diode will begin to breakdown at a slightly lower voltage, about 3.3 volts, as is well-known in the art.) The reference voltage supply will then refuse to raise the reference voltage any further, limiting the output current from the pin power amplifier to 1.5 amps.

Output from the pin power amplifier is drawn to the clamping circuit, which consists simply of two diodes connected to $v_{+cl}$ 124 and $v_{-cl}$ 126. When the output from the pin power amplifier 142 falls outside the voltage range defined by $v_{+cl}$ 124 and $v_{-cl}$ 126, current will flow across one of the two diodes and the voltage will be limited to that range. This assures that the voltage presented to the pin of the device under test 148, $v_{pin}$ 148, is limited to the range specified by the DUT manufacturer. Fast-switching (e.g., Schottky) diodes are used for fast switching and to assume that voltage spikes are handled quickly enough.

Lastly, since a TTL "1" value is so commonly required, by device manufacturers, a +5 volt source 426 and a pull-up resistor 428 are used to assert a TTL "1" value to each pin where necessary. When no controlling voltage is asserted to the pin (i.e., the pin is "floated") the device under test will see a +5 volt input at this pin. This avoids using a separate reference voltage for this commonly used value.

It should be apparent to those skilled in the art that the reference voltage supply's $v_{ref}$ output voltage value 114, the device pin voltage value $v_{pin}$ 148, and the $v_{fb}$ feedback voltage value 116, form a closed loop voltage and power amplifier. In the steady state this closed loop produces a known voltage within a known current range at the device pin, under direction of the programmable microprocessor.

Those skilled in the art will recognize that while a presently preferred embodiment has been disclosed, variations are possible without departing from the intended scope of the present invention.

I claim:

1. A programmable pin driver system for controlling inputs to device pins, comprising:
   at least one reference voltage means for supplying reference voltages which may be asserted to the device pins;
   rail voltage means, reponsive to the reference voltage means, for generating rail voltages whose range includes at least one of the reference voltages;
   voltage multiplexor means for selecting reference voltages to supply to the device pins; and
   pin amplifier means for power amplification of the reference voltages, responsive to the rail voltage means and drawing power from the rail voltages.

2. The programmable pin driver system of claim 1, wherein the rail voltage means responds to changes in the reference voltages with substantially immediate changes in the rail voltages.

3. The programmable pin driver system of claim 1, wherein the rail voltages are set at a fixed offset voltage voltage higher than the maximum reference voltage and at a fixed offset voltage lower than the minimum reference voltage.

4. The programmable pin driver system of claim 3, wherein the offset voltage is about 5 volts.

5. The programmable pin driver system of claim 3, wherein the offset voltage is about 10 volts.

6. The programmable pin driver system of claim 1, further including clamping means for assuring that no voltage supplied to the device pin exceeds the voltage range which the device is capable of accepting without damage.

7. The programmable pin driver system of claim 1, wherein the reference voltage means includes:
   digital reference means for supplying digital values which are numeric representations of the reference voltages;
   digital to analog converter means for converting digital values supplied by the digital reference means to analog voltages; and
   voltage multiplier means for multiplying the analog voltages which are supplied by the digital to analog converter means to assure that the reference voltages are in the proper voltage range.

8. The programmable pin driver system of claim 7, wherein the digital reference means is a microprocessor operating under software control.

9. The programmable pin driver system of claim 7, further including voltage multiplier adjustment means, for adjusting the gain of the voltage multiplier means.

10. The programmable pin driver system of claim 9, wherein the voltage multiplier adjustment means is a adjustable resistor in the voltage multiplier means.

11. The programmable pin driver system of claim 1, further including measurement means, for measuring the outputs from the device pins.

12. The programmable pin driver system of claim 11, wherein the measurement means include:
   floated input means for attaching a floated input line to the device pin, so that the device may alter it to provide output voltages;
   reference voltage means for supplying the reference voltage which the device pin will conditionally exceed; and
   comparator means for comparing the actual device output voltage with the reference voltage supplied by the reference voltage means.

13. The programmable pin drive system of claim 1, further including other supplied signals.

14. The programmable pin driver system of claim 13, wherein the other supplied signals are:
   a grounded line;
   a floated line;
   a positive votage pulse; and
   a negative voltage pulse.

15. The programmable pin drive system of claim 13, wherein the voltage multiplexor means includes:
   stage I voltage multiplexor means for multiplexing other supplied reference signals; and
   stage II voltage multiplexor means for multiplexing the signals output from the reference voltage means.

16. The programmable pin driver system of claim 1, wherein the voltage multiplexor means operates under microprocessor control.

17. The programmable pin driver system of claim 1 wherein the reference voltage means operate under microprocessor control.

18. A programmable pin driver system for controlling inputs to device pins comprising:
   at least one reference signal means for supplying reference signals which may be asserted to the device pins;
   rail voltage means, responsive to the reference voltage means, for generating rail voltages whose range includes at least one reference signals which may be supplied to the device pins;
   signal multiplexer means for selecting reference signals to supply to the device pins; and
   pin amplifier means for power amplification of the reference signals, responsive to the rail voltage means and drawing power from the rail voltages.

19. The programmable pin driver of claim 18, wherein the rail voltage responds to changes in the reference voltages with substantially immediate changes in the rail voltages.

20. The programmable pin driver system of claim 18, wherein the rail voltages are set at an a fixed offset voltage higher than the maximum voltage of any reference signal and at a fixed offset voltage lower than the minimum voltage of any reference signal.

21. The programmable pin driver system of claim 20, wherein the offset voltage is about 5 volts.

22. The programmable pin driver of claim 20, wherein the offset voltage is about 10 volts.

23. The programmable pin driver system of claim 18, further including clamping means for assuring that no voltage supplied to the device pin exceeds the voltage range which the device is capable of acceptable without damage.

24. The programmable pin drive system of claim 18, wherein the reference signals means includes:
   programmed reference means for supplying digital values which are numeric representations of the reference signals; and
   program to signal converter means for converting digital values supplied by the programmed reference means to analog signals.

25. The programmable pin driver system of claim 24, wherein the programmed reference means is a microprocessor operating under software control.

26. The programmable pin driver system of claim 18, further including measurement means, for measuring the outputs from the device pins.

27. The programmable pin driver system of claim 26, wherein the measurement means includes:
- floated input means, for attaching a floated input line to the device pin, so that the device may alter it to provide output voltages;
- reference signal means, for supplying the reference signal which the device pin will nditionally equal; and
- comparator means, for comparing the actual device output signal with the reference signal supplied by the reference voltage means.

28. A programmable pin driver system for controlling inputs to and measuring outputs from programmable device pins, comprising:
- at least one reference voltage means for supplying reference voltages which may be asserted to the device pins, the reference voltage means itself comprising:
  - digital reference means for supplying digital values which are numeric representations of the reference voltages, wherein the digital reference means is a microprocessor operating under software control;
  - digital to analog converter means for converting digital values supported by the digital reference means to analog voltages; and
  - voltage multiplier means for multiplying the analog voltages which are supplied by the digital to analog converter means to assure that the reference voltage are in the proper voltage range.
- rail voltage means, responsive to the reference voltage means, for generating rail voltages at a fixed offset voltage higher than the maximum reference voltage and at a fixed offset voltage lower than the minimum reference voltage;
- voltage multiplexor means for selecting reference voltages to supply to the device pins, the voltage muliplexor means itself comprising:
  - stage I voltage multiplexor means, for multiplexing constant supplied reference signals; and
  - stage II voltage multiplexor means, for multiplexing the signals output from the stage I voltage multiplexor means, and the voltages output from the reference voltage means;
- pin amplifier means for power amplification of the reference voltages which are to be supplied to the device pins; responsive to the rail voltage means and drawing power from the rail voltages;
- clamping means for assuring that no voltage supplied to the device pin exceeds the voltage range which the device is capable of accepting without damage;
- measurement means for measuring the outputs from the device pins, the measurement means itself comprising:
  - floated input means for attaching a floated input line to the device pin, so that the device may alter it to provide output voltages;
  - reference voltage means for supplying the reference voltage which the device pin will conditionally exceed; and
  - comparator means for comparing the actual device output voltage with the reference voltage supplied by the reference voltage means.

29. A programmable pin driver system for controlling inputs to device pins, comprising:
- reference voltage means for supplying reference voltages which may be asserted to the device pins;
- rail voltage means, responsive to the reference voltage means, for generating rail voltages whose range includes all of the reference voltages;
- means, electrically connecting the reference voltage means and the rail voltage means, for communicating the reference voltages to the rail voltage means;
- voltage multiplexor means for selecting reference voltages to supply to the device pins; and
- pin amplifier means for power amplification of the reference voltages, responsive to the rail voltage means and drawing power from the rail voltages.

30. The programmable pin driver system of claim 29, wherein the rail voltage means responds to changes in the reference voltages with substantially immediate changes in the rail voltages.

* * * * *